United States Patent [19]
Flatley et al.

[11] Patent Number: 4,839,587
[45] Date of Patent: Jun. 13, 1989

[54] TEST FIXTURE FOR TAB CIRCUITS AND DEVICES

[75] Inventors: Robert Flatley, Ashland; David Hobson, Waltham, both of Mass.

[73] Assignee: Digital Equipment Corporation, Maynard, Mass.

[21] Appl. No.: 174,697

[22] Filed: Mar. 29, 1988

[51] Int. Cl.⁴ .................... G01R 31/02; G01R 31/28
[52] U.S. Cl. ............................ 324/158 F; 324/73 PC; 324/158 P
[58] Field of Search ........... 324/158 F, 158 P, 73 PC; 333/246, 238; 62/3; 439/55; 437/8

[56] References Cited

U.S. PATENT DOCUMENTS

| | | | |
|---|---|---|---|
| 3,643,201 | 2/1972 | Harwood | 333/238 X |
| 3,710,251 | 1/1973 | Hagge et al. | 324/158 F |
| 3,979,671 | 9/1976 | Meeker et al. | 324/158 F |
| 4,402,185 | 9/1983 | Perchak | 62/3 |
| 4,560,962 | 12/1985 | Barrow | 333/238 X |
| 4,604,572 | 8/1986 | Horiuchi et al. | 374/45 X |
| 4,616,178 | 10/1986 | Thornton et al. | 324/158 FX |
| 4,672,313 | 6/1987 | Hartmann et al. | 324/158 F |
| 4,727,720 | 3/1988 | Wernicki | 62/3 X |

Primary Examiner—Reinhard J. Eisenzopf
Assistant Examiner—Vinh P. Nguyen
Attorney, Agent, or Firm—Jones, Tullar & Cooper

[57] ABSTRACT

A test fixture for TAB (Tap Automated Bonding) circuits includes circuit boards for maintaining a characteristic impedance to inner lead bond areas of a circuit under test. A plurality of vertically disposed test pins are soldered to conductors in one of the circuit boards, and provide contacts for supplying power and test signals to test pads on a circuit under test. A thermoelectric heat pump is thermally connected to a circuit under test with a copper thermal chuck or heat spreader, and is used to subject the circuit to a wide range of operating temperatures. A two piece anvil is provided to apply pressure to the test pad/test pin interface and to the circuit die/thermal chuck interface.

9 Claims, 3 Drawing Sheets

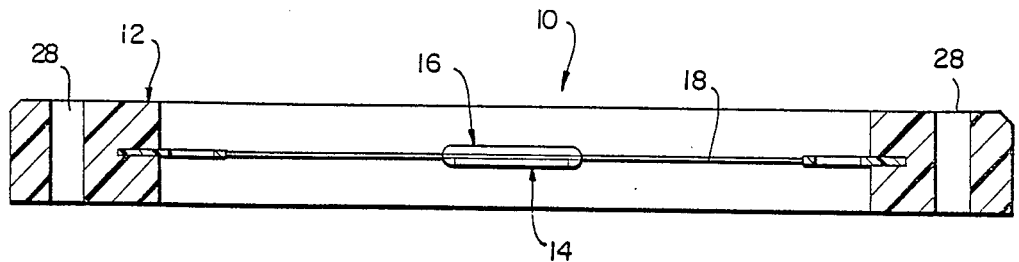
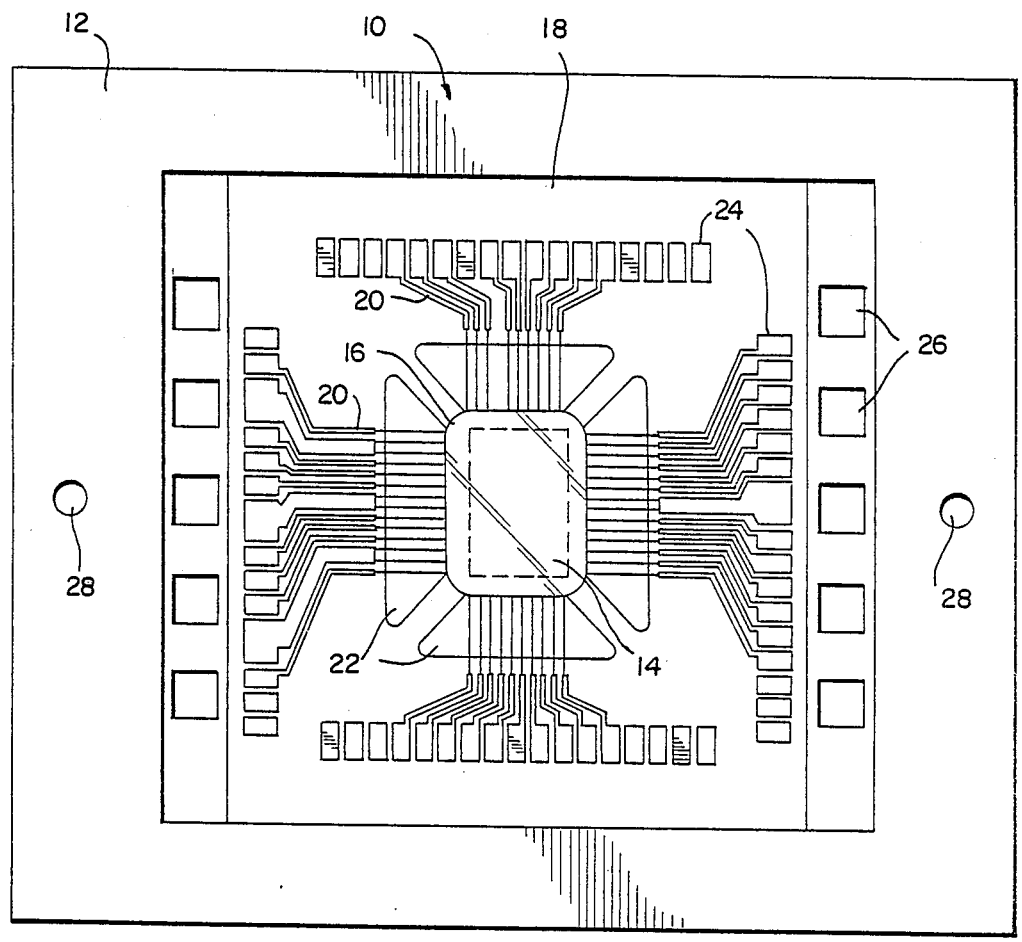

TEST FIXTURE FOR TAB CIRCUITS AND DEVICES

BACKGROUND OF THE INVENTION

The present invention relates, in general, to a test fixture for high speed and power TAB (Automated Bonding) type semiconductor circuits or devices.

TAB circuits or devices are formed by attaching a semiconductor circuit die to a supporting film having a plurality of conductor leads etched thereon. The film contains sprocket holes similar to those found on a reel of 35 mm film. The circuit dies or devices are centrally located on the film, and are mechanically and electrically secured to the etched conductor leads which fan out to bonding pads along the outside edges of the film.

The testing of semiconductor circuits in TAB type form presents a combination of formidable engineering problems. Each of the circuits tested must be subjected to a wide range of temperatures to insure that they will operate properly over their full specified range. In addition, electrical connections and controlled impedance paths to each of the circuits must be provided so that all of their functions can be properly tested.

The present invention seeks to provide a test fixture which meets these criteria.

SUMMARY OF THE INVENTION

It is therefore the object of the present invention to provide a test fixture for TAB type high power semiconductor circuits or devices which provides adequate electrical connections and controled impedance signal paths to the circuits under test, and can control the temperature to which the circuits are exposed over a wide range.

This, and other objects of the invention are attained through the provision of a test fixture for reception of a TAB type circuit which includes special circuit boards for maintaining a 50 ohm transmission line to the TAB inner lead bond connections of the circuit, and a thermoelectric heat pump for controllably varying the operating temperature of the circuit.

The test fixture receives a film slide type carrier which holds the TAB type semiconductor circuit to be tested. An anvil is utilized to apply weight on the top side of the TAB film through a window in the slide carrier to insure that a good electrical connection is made between test pads on the TAB film, and a plurality of test pins that project vertically from a test fixture main circuit board disposed beneath the slide carrier.

To maintain a 50 ohm transmission line to the circuit under test, the main circuit board is provided with a conventional microstrip design to supply signals and power to the test pins. A second smaller special circuit board is provided to maintain the 50 ohm signal path from the test pins to the inner lead bond area of the TAB circuit. This circuit board includes holes for reception of the test pins, and has its edges metal plated to provide a constant voltage reference plane for the pins. This reference plane also extends along the top surface of the special circuit board, and runs parallel to the circuit conductors that are etched in the TAB film from the test pads to the die bond connections of the circuit die. A thin dielectrical sheet separates the TAB film conductors from the reference plane. Both of these reference planes serve to maintain the desired 50 ohm impedance all the way to the TAB inner lead bond connections of the circuit under test.

The thermoelectric heat pump is provided to enable the circuit under test to be subjected to a complete range of temperature to insure that it operates properly over the entire range. A copper thermal chuck is utilized to provide a thermal path between the heat pump and the circuit under test, and a large heat sink is attached to the pump. Through the use of a programmable power supply for the heat pump, the circuit under test can automatically be subjected to a full range of operating temperatures.

BRIEF DESCRIPTION OF THE DRAWINGS

The foregoing, and additional objects, features, and advantages of the present invention will become apparent from a consideration of the following detailed description of the preferred embodiment thereof, taken in conjunction with the accompanying drawings in which:

FIGS. 1A and 1B, are diagrammatic top and cross sectional side views, respectively, of a TAB circuit and carrier frame;

DETAILED DESCRIPTION OF THE PREFERRED EMBODIMENT

Figure 2:
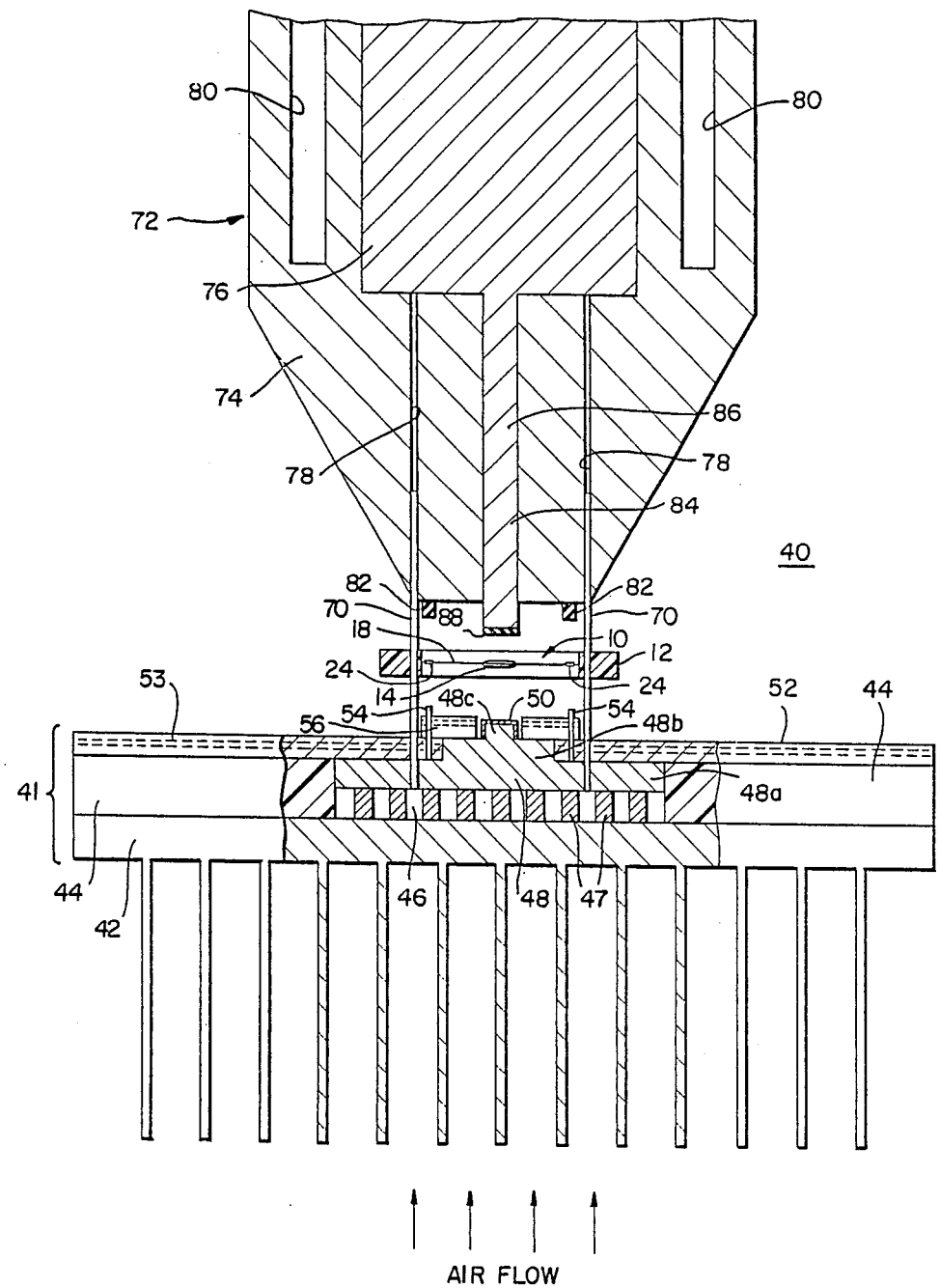
FIG. 2 is a diagrammatic cross sectional front view of the test fixture.

Turning now to a more detailed consideration of the present invention, there is illustrated in FIGS. 1A and 1B, a Tape Automated Bonding (TAB) type integrated circuit 10, and a carrier frame 12 for the same. Circuit 10 includes a circuit die 14 that is surrounded by a body of encapsulation material 16, and is mounted on a Kapton film 18.

A plurality of conductors 20 are etched on the film 18, and provide electrical paths between a plurality of inner lead bond areas 22 of circuit 10 where the conductors are electrically connected to leads (not shown) of die 14, and a plurality of test pads 24 that are disposed around the periphery of circuit 10. A plurality of sprocket holes 26 are provided in film 18 along two of its edges which are used in the manufacture and handling of circuit 10.

Carrier frame 12 is formed from any suitable material, such as plastic, and is designed in any suitable manner to securely hold the edges of film 18. A pair of holes 28 are provided in carrier frame 12 to receive test fixture guide rods that help align circuit 10 with the test fixture.

Turning now to FIG. 2, there is illustrated a test fixture 40 for receiving circuit 10 and carrier frame 12 in a circuit side down manner. Fixture 40 includes a layered base structure 41 having a heat sink 42 as its bottom layer, which can be made of any suitable heat conducting material. If desired, heat sink 42 can be cooled by forced air from a fan (not shown). Disposed on top of heat sink 42 near its outer edges, is a layer 44 of thermal insulation. A thermoelectric heat pump 46 is disposed on top of heat sink 42 in an opening in insulation layer 44. The interface between sink 42 and pump 46 can be coated with a thermal grease to reduce the thermal contact resistance.

The thermoelectric heat pump 46 is a known type of device which is comprised of an array 47 of two heavily doped semiconductor junctions connected between a pair of smooth ceramic plates. When a dc voltage is applied to the heat pump, one plate of the pump, depending on the polarity of the voltage, will absorb heat at a rate proportional to the current flowing from the power source. The heat absorbed is transferred to the other plate and must be removed by some means of cooling such as heat sink 42. With these devices, it is possible to obtain differences in temperature of up to 70 degrees Celsius between the two plates. Reversing the direction of the current reverses the heat flow direction. These devices can therefore be used for both heating and cooling an object, and ar thus suitable for use with the present invention, which is designed to subject the circuits under test to temperatures ranging from 20 to 90 degrees Celsius. It will be understood that any suitable type of programmable power supply can be used to control heat pump 46 to automatically vary the device temperature over this range.

Although thermoelectric heat pump 46 provides an attractive means by which the temperature of a circuit under test can be variably controlled, the relatively low efficiency of this type of heat pump indicates that the size of the pump must be considerably larger than the circuit to be able to cool it down to the low end of the specified temperature range. To solve this problem, a copper thermal chuck or heat spreader 48 is disposed on top of heat pump 46 which provides a good thermal path between pump 46 and circuit die 14 when the circuit is in position on the test fixture. Chuck 48 is a three tiered structure that includes a large bottom pedestal 48a, a middle pedestal 48b, and a small top pedestal 48c. Bottom pedestal 48a is attached directly to the top of heat pump 46, while top pedestal 48c is designed to contact circuit die 14 when carrier 12 is in position.

To provide a cushion, and to correct for any dimensional mismatches, between circuit die 14 and chuck 48, a thin sheet of thermally conductive material 50 is placed on top pedestal 48c. This material is a thermal conductor when placed under pressure, and consists of a thin metal sheet that is coated on both sides with a silicon rubber. Such a material is manufactured by the Bergquist Company of Minneapolis, Minn. under the name Q-PAD.

Disposed on top of insulation layer 44, and bottom pedestal 48a, is a horizontally disposed main circuit board 52, for supplying power and test signals to the circuit under test. To maintain a 50 ohm transmission line to the circuit, conventional microstrip design techniques are employed on the main circuit board 52 by providing an embedded constant voltage reference plane (shown by dashed lines 53).

A plurality of test pins 54 are soldered to main circuit board 52 and extend vertically through the top of the board as shown. These test pins are electrically connected to the microstrip circuitry in board 52 so that they can transmit power and control signals to the test pads 24 of circuit 10 when it is in position on the test fixture.

A second special circuit board 56 is horizontally disposed on middle pedestal 48b of thermal chuck 48 and on the inner portions of main circuit board 52 over pins 54. This special board serves to maintain a controlled 50 ohm signal path through test pins 54, and all the way to the inner lead bond areas 22 of circuit 10, and is shown in greater detail in FIGS. 3A and 3B.

Figure 3B:
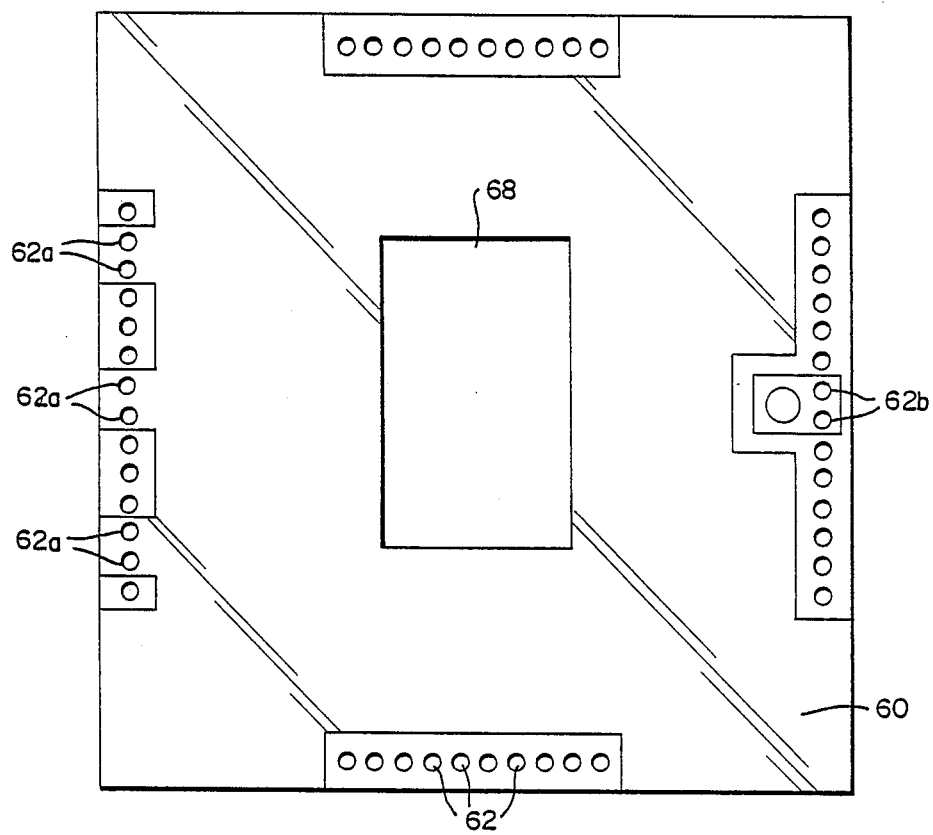
FIG. 3A is a diagrammatic partial cross sectional side view of a special circuit board that forms a part of the test fixture; and, FIG. 3B is a diagrammatic top view of the special circuit board.
Figure 3A:
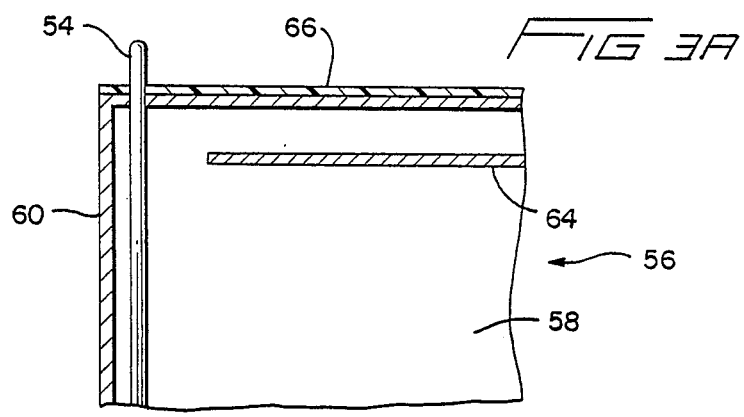

Specifically, in FIG. 3A, there is shown a partial cross sectional view of board 56, which includes an insulating substrate 58. A conductive layer 60 is disposed on all four edges of substrate 58. Each of the test pins 54 (one shown) passes through a corresponding one of a plurality of holes 62 disposed in substrate 58, as illustrated in FIG. 3B. By placing conductive layer 60 along each edge of substrate 58, a ground reference plane is established for each of the test pins 54. In this manner, a controlled impedance path is obtained along test pins 54, since each of the pins is disposed parallel to, and at a fixed distance from, this reference plane.

Conductive layer 60 also extends along the top of substrate 58 so that a ground reference plane will also be established for circuit conductors 20 when circuit 10 is disposed in position on top of board 56. Also, a voltage reference plane is established by a second horizontally disposed conductive layer 64 that is embedded within substrate 58. In this manner, a 50 ohm controlled impedance path can also be established along conductors 20 of circuit 10 between test pads 24, and inner lead bond areas 22. To obtain the desired impedance, a thin dielectric polymer layer 66 is disposed over the top portion of first conductive layer 60 to control the spacing between conductors 20 of circuit 10 and the voltage and ground references planes of special circuit board 56, when the circuit 10 is in position on the same. If it is desired to maintain the 50 ohm impedance all the way past the inner lead bond areas 22 to the circuit die 14 where the width of conductors 20 reduces as illustrated in FIGS. 1A, the thickness of the dielectric layer 66 in that region would have to be correspondingly reduced as well.

As shown in the top view illustrated in FIG. 3B, special circuit board 56 includes a rectangular opening 68 in the center thereof so that the top pedestal 48c of thermal chuck 48 can make contact with circuit die 14. Also, conductive layer 60 is shown as extending to only a small number of the test pin holes 62 which are labeled 62a. These are the holes which are to receive the ground test pins.

Two of the test pins holes, labeled 62b, are also electrically isolated from conductive layer 60, and are connected below to the second conductive layer 64. These holes receive the power supply test pins, and provide for capacitive decoupling of the power supply connections to the circuit under test. Sheet capacitance is provided both in the special circuit board 56 and the main circuit board 52 in this manner by placing both power signals in circuit board layers that are in close physical proximity to one another.

Returning now to FIG. 2, a pair of guide rods 70 extend vertically from thermal chuck 48 through main circuit board 52. These guide rods are positioned to pass through the holes 28 in carrier frame 12 to guide the carrier into position on the test fixture 40. When carrier frame 12 is in position, the face down circuit die 14 will rest on top of thermal chuck 48, and, test pads 24 will contact the tops of test pins 54.

To insure that circuit die 14 is held with sufficient pressure against the pressure responsive thermally conductive sheet 50, and that test pads 24 make good electrical contact with test pins 54, a two piece anvil 72 is utilized to apply pressure to these areas of the circuit 10. Anvil 72 includes an outer weight 74, and a center weight 76, both of which are independent of one another so that the pressure applied to the test pads 24 is independent of the pressure applied to circuit die 14.

Disposed in the bottom portion of outer weight 74, are two holes 78 for reception of guide rods 70. A pair of cavities 80 are disposed in the upper portion of outer weight 74 that can be filled with lead beads, or other material, to adjust the weight of the outer weight as necessary to obtain the desired level of pressure on test pads 24. Similar cavities can also be disposed in center weight 76 if desired for adjustment of its weight as well.

A pair of silicon rubber strips 82 are disposed on the bottom of outer weight 74, which are positioned to contact Kapton film 18 of circuit 10 directly opposite test pads 24. These rubber strips transmit the weight of outer weight 74 to the test pad/test pin connections, and accommodate any dimensional mismatches in the test pins 54.

Anvil center weight 76 includes a narrow elongated bottom portion 84 which passes through a centrally disposed opening 86 in outer weight 74. Disposed on the end of bottom portion 84 is another silicon rubber strip 88, which is generally the same size and shape as that of circuit die 14, and is positioned to contact the encapsulation material directly opposite the die. Again, this strip accommodates dimensional mismatches between die 14 and center weight 76, and transmits pressure froom the weight to the die 14 to insure good thermal contact between the die and the sheet 50, and between sheet 50 and thermal chuck 48.

From the foregoing, it may be thus seen that test fixture 40 provides good electrical connections to the circuit 10 through the use of test pins 54 and anvil 72. Proper signal integrity is obtained by maintaining a 50 ohm transmission line to the circuit die 14 through the use of main and special circuit boards 52 and 56, and their voltage and ground reference planes. Finally, the temperature of the circuit 10 is controllable over a wide range through the use of thermoelectric heat pump 46, thermal chuck 48, and heat sink 42.

Although the invention has been illustrated in terms of a preferred embodiment, it will be understood that numerous variations and modifications can be made by those of skill in the art without departing from the true spirit and scope thereof as set forth in the following claims.

What is claimed is:

1. A test fixture for semiconductor circuits comprising:
   means to receive a circuit to be tested;
   transmission line means having a controlled impedance to supply power and control signals to a received circuit; said transmission line means comprising:
   a first circuit board having a characteristic impedance established by a plurality of conductive paths disposed therein;
   a plurality of vertically extending test pins soldered to said first circuit board and electrically connected to said plurality of conductive paths, and,
   a second circuit borad disposed on said first circuit board which includes;
   (a) a plurality of vertically extending holes for reception of said test pins;
   (b) a conductive layer plated on a plurality of edges of said second circuit board to establish a reference plane for said test pins, and extending along a top surface of said second circuit board; and,
   (c) a dielectric layer disposed on said top surface so that when a received circuit having horizontally disposed conductors is placed on top of said second circuit board, said conductive layer extending along said top surface will establish a reference plane for the horizontally disposed conductors of a received circuit so that the characteristic impedance of the conductors is controlled;
   means to electrically contact said transmission line means to circuit leads of a received circuit and,
   means to vary the temperature to which a received circuit is exposed.

2. The circuit test fixture of claim 1, further including means to hold the circuit leads of a received circuit in contact with said test pins.

3. The circuit test fixture of claim 2, wherein said means to hold comprises a weight for placement on top of a received circuit when it is in position on said second circuit board and said test pins.

4. A test fixture for TAB type semiconductor circuits comprising:
   means to receive a TAB circuit for testing;
   transmission line means to supply power and test signals to a received circuit, said transmission line means including means to maintain a controlled impedance to the inner lead bond areas of a received TAB circuit, and comprising:
   (a) a first horizontally disposed circuit board having embedded conductors disposed therein for supplying power and signals to a received circuit, said embedded conductors establishing a characteristic impedance for said first circuit board;
   (b) a plurality of test pins positioned to contact the test pads of a received TAB circuit, said test pins being soldered to said first circuit board, electrically connected to said embedded conductors, and extending vertically from said first circuit board; and,
   (c) a second horizontally disposed circuit board placed generally on top of said first circuit board, and having a substrate with a plurality of holes for reception of said test pins, said second circuit board including:
   (i) a first conductive layer disposed on a plurality of edges thereof and including a top portion extending along a top surface thereof, said first conductive layer establishing a reference plane for said test pins to maintain a characteristic impedance therefore;
   (ii) a dielectric layer disposed over the top portion of said first conductive layer to space a received TAB circuit from said conductive layer when it is position on said second circuit board, and thereby establish a characteristic impedance for conductor leads of a received circuit; and,
   (iii) a second conductive layer that is horizontally embedded in said substrate to establish another reference plane for a received TAB circuit, said second conductive layer being electrically connected to at least one of said test pins when said second circuit board is in position on said first circuit board;
   weight means to hold the test pads of a received TAB circut in secure engagement with said test pins; and,
   means to vary the temperature to which a received TAB circuit is exposed.

5. A test fixture for TAB type semiconductor circuits comprising:
   means to receive a TAB circuit for testing;

transmission line means to supply power and test signals to a received circuit, said transmission line means including means to maintain a controlled impedance to the inner lead bond area of a received TAB circuit;

means to vary the temperature to which a received TAB circuit is exposed comprising:
 (a) a heat pump for supplying heat to, and drawing heat away from, a received circuit; and,
 (b) a thermal chuck having a top portion for contacting an encapsulated circuit die body of a receive TAB circuit, and a bottom portion for contacting said heat pump; and, first weight means to apply pressure to an encapsulated circuit die body of a received TAB circuit, to firmly engage a received TAB circuit with said thermal chuck.

6. The test fixture of claim 5, further including cushion means comprising a thermally conductive sheet of material disposed on said top portion of said thermal chuck.

7. The test fixture of claim 6, wherein said thermally conductive sheet of material comprises a thin metal sheet having top and bottom sides coated with silicon rubber.

8. The test fixture of claim 5, further including second weight means to apply pressure to the test pads on a received TAB circuit to firmly engage them with said means to electrically contact.

9. The test fixture of claim 8, further including means to adjust the weight of said second weight means.

* * * * *